United States Patent [19]
Thoma et al.

[11] 4,273,185
[45] Jun. 16, 1981

[54] DEVICE FOR HOLDING A DISC-SHAPED SEMICONDUCTOR ELEMENT

[75] Inventors: Kurt Thoma, Birr; Urban Ulrich, Fislisbach, both of Switzerland

[73] Assignee: BBC Brown, Boveri & Company, Limited, Baden, Switzerland

[21] Appl. No.: 971,543

[22] Filed: Dec. 20, 1978

[30] Foreign Application Priority Data
Jan. 17, 1978 [CH] Switzerland .................... 457/78

[51] Int. Cl.³ .................. H01L 23/02; F28F 7/00
[52] U.S. Cl. .................. 165/80 B; 174/15 R; 357/81; 174/16 HS
[58] Field of Search .......... 165/80 A, 80 B, 80 R, 165/80 E; 174/15 R, 16 HS; 357/81

[56] References Cited
U.S. PATENT DOCUMENTS
4,104,677  8/1978  Kovar et al. .................. 165/80 B Primary Examiner—Samuel Scott
Assistant Examiner—Theophil W. Streule, Jr.
Attorney, Agent, or Firm—Burns, Doane, Swecker & Mathis

[57] ABSTRACT

A holding device for disc-shaped semiconductor elements on a supporting wheel, particularly a rotating semiconductor device, is disclosed and includes two clamping members between which the semiconductor element is gripped by its end faces. At least one electrical connection is also between the clamping members. The holding device further comprises a resilient member for producing a contact pressure. The clamping members, the semiconductor element and possibly the associated cooling elements are preferably disposed as a fully assembled structural unit in recesses at the outer periphery of the supporting wheel.

11 Claims, 3 Drawing Figures

DEVICE FOR HOLDING A DISC-SHAPED SEMICONDUCTOR ELEMENT

BACKGROUND AND SUMMARY OF THE PRESENT INVENTION

The present invention relates to a holding device for mounting disc-shaped semiconductor elements on a supporting wheel, particularly a rotating rectifier device.

A rotating rectifier device for electrical machines is known from the DT-OS No. 25 11 636, wherein the disc-shaped semiconductor elements are resiliently gripped at the inner periphery of the annular flange of a supporting wheel. Each semiconductor element is disposed between a radially outward and a radially inward clamping member which are bolted in an insulated manner to the annular flange of the supporting wheel through bolts, in such a manner that the element bears with one of its end faces directly against the radially outward clamping member while a three-phase connecting conductor and a compression spring are disposed at the other end face, between the semiconductor element and the radially inward clamping member. The supporting wheel, which is composed of a plurality of parts, is provided with a shrunk-on cap ring at its annular flange to increase the strength.

Such a rectifier device is very expensive in view of the material needed and the assembly. A large number of individual parts are necessary, for the production of which some expensive operations are necessary. The assembly of the individual parts is time-consuming and is made more difficult by the inserted arrangement of the structural unit at the inner periphery of the annular flange. Particularly in cases of repair, when the replacement of the semiconductor elements is necessary, the complicated and tedious dismantling and installation lead to the machine being out of action for a long time. Another problem is the heating which occurs at the semi-conductor elements during operation. It is therefore necessary to make provision for satisfactory cooling, particularly in order to protect the semiconductor elements. This is not the case, however, in the embodiment because a stream of air in the axial direction is not possible and a layer of air under the annular flange participates in the rotation and is hot after only a short time.

It is an object of the invention to provide a holding means for disc-shaped semiconductor elements on a supporting wheel which can be assembled in a simple and reliable manner and wherein a satisfactory cooling of the semiconductor elements is assured.

In a holding device of the kind referred to at the beginning, this problem is solved, according to the invention, in that the clamping members, the semiconductor element and possibly the associated cooling elements are disposed as a fully assembled structural unit in recesses at the outer periphery of the supporting wheel.

The important advantages of the invention are to be seen, in particular, in the following:

the production and assembly of the holding device leads to a considerable saving in costs and time, the fully assembled structural unit can be replaced very simply and quickly, which is a great advantage, particularly in cases of repair, the fully assembled structural unit can be easily stored and dispatched as a complete spare part, the semiconductor element is considerably better cooled than in the devices previously known.

An advantageous further development of the subject of the invention consists in that one of the clamping members is a supporting member and the other clamping member is a yoke movably secured to the supporting member. In another appropriate further development, one of the clamping members is a supporting member which, together with a yoke, forms a carrier, and the other clamping member is a cooling member disposed on the yoke. In devices in which the carrier serves as an electrical connection, an insulating member is disposed between the cooling member and the yoke in order to avoid short-circuits.

It is an advantage to mount the cooling member on the insulating member in the manner of a ball-and-socket joint. As a result of this mounting, unequal loading, which may occur as a result of gripping askew, is compensated. Cup springs with a clamping device are well suited as means for producing a contact pressure. A particular form of construction consists in that the cup springs are disposed in a cylinder on the yoke and the clamping device consists of a thrust washer and a tightening screw with a central bore screwed into the cylinder. This arrangement renders possible a precise tightening of the cup springs with a press. The carrier comprising the supporting member and the yoke may appropriately be constructed in the form of a CrCu casting in one piece. This leads to the following advantages:

ease of manufacture,
high mechanical strength,
satisfactory heat conductivity.

It has proved particularly favourable to hold the spring with a force of 500 Kp to 1000 Kp, preferably 600 Kp.

BRIEF DESCRIPTION OF THE DRAWINGS

Further details of the invention are described with reference to the accompanying drawings of a particular embodiment of the present invention wherein like members bear like reference numerals and wherein.

DETAILED DESCRIPTION OF THE PREFERRED EMBODIMENT

Figure 1:
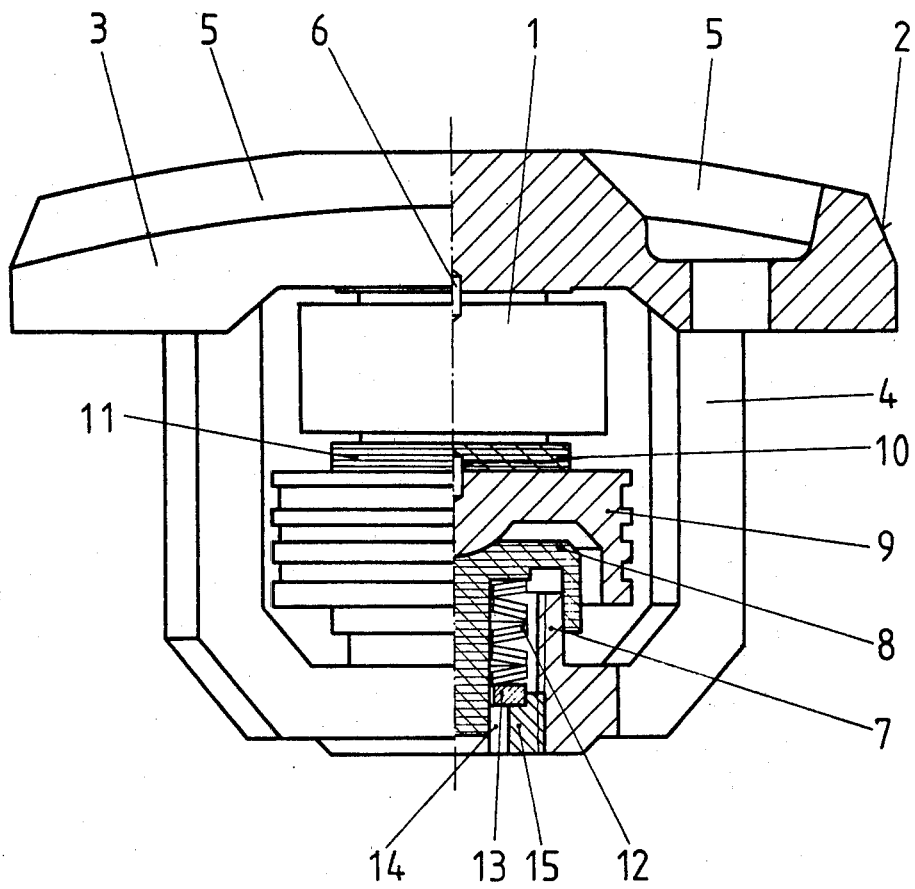
FIG. 1 is a side view in partial cross section of a holding device with a clamping device for disc-shaped semiconductor elements according to the present invention.

In FIG. 1, a semiconductor element (diode, thyristor) 1 is disposed in a carrier 2 which consists of a supporting member 3 and a yoke 4. The supporting member 3 is provided with cooling fins 5 at the side remote from the yoke 4. The face of the supporting member 3 between the foot points of the yoke 4 is constructed in the form of a contact surface for the semiconductor element 1 and is provided with a positioning pin 6 in the middle. The web of the yoke 4 comprises a cylinder 7 which is directed towards the supporting member 3 and which is provided with a central bore with a thread. An insulating member 8 of fibre-reinforced plastics material is disposed over the cylinder 7 as a cap. The insulating member 8 comprises a spherical depression in the middle at its side adjacent to the semiconductor element 1.

A cooling member 9 of aluminum is provided, at the side adjacent to the insulating member 8, with a spherical raised portion which engages in the depression in the insulating member 8. The plane side of the cooling member 9 adjacent to the semiconductor element 1 comprises a positioning pin 10 in the middle. An electrical connection 11, for example a piece of sheet copper, is disposed between the semiconductor element 1 and the cooling member 9.

Ten cup springs 12 are disposed in the central bore of the cylinder 7, between the insulating member 8 and a thrust washer 13. The thrust washer 13 bears against a tightening screw 15 which is provided with a central bore 14 and which is screwed into the thread in the bore of the cylinder 7.

Figure 2:
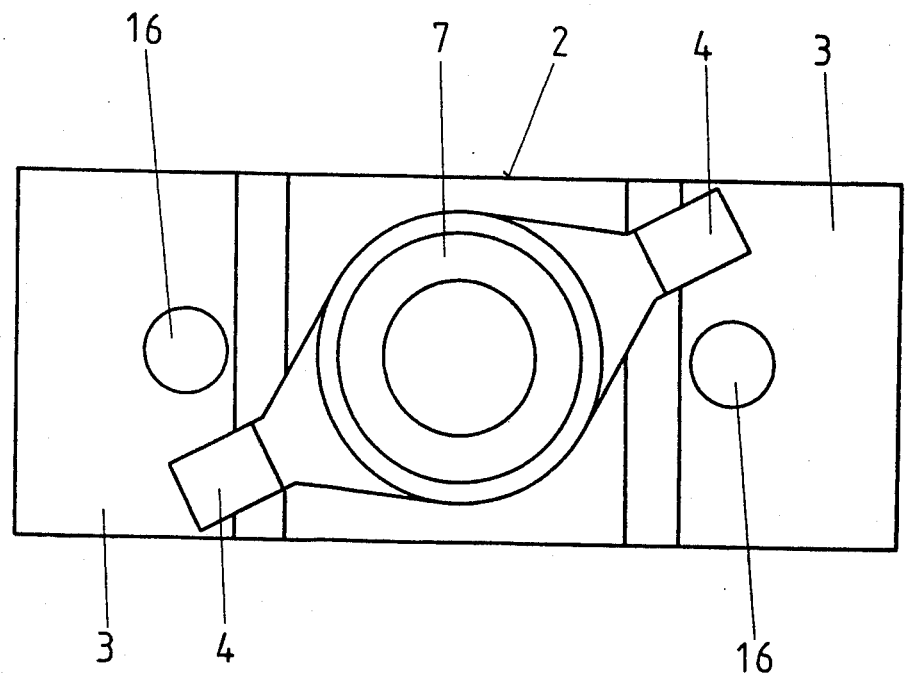
FIG. 2 is a bottom view of the holding device of FIG. 1.

In FIG. 2, the unequipped carrier 2 is illustrated in a view from below, the symbols corresponding to those of FIG. 1. The foot points of the yoke 4 are disposed substantially in a diagonal of the contact surface of the supporting member 3. Two bores 16 are provided in the supporting member 3.

Figure 3:
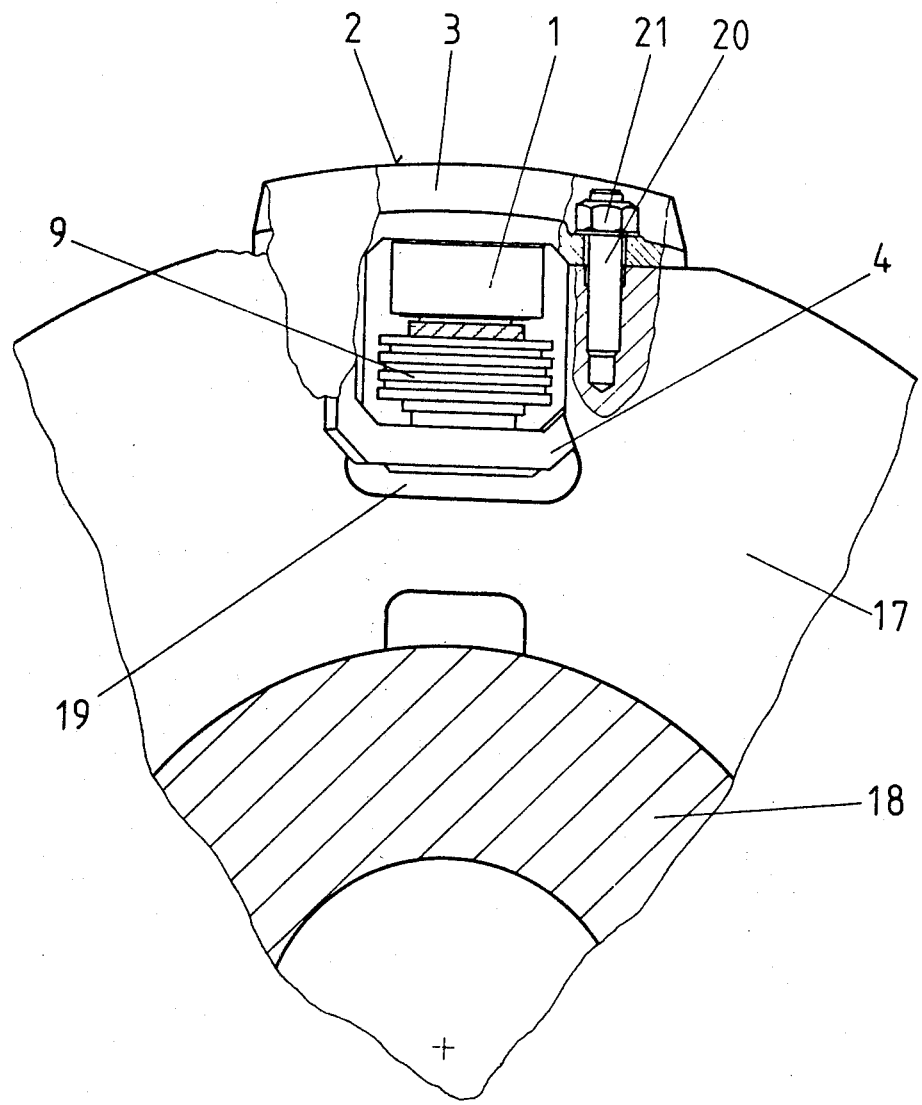
FIG. 3 is a view of the holding device of FIG. 1 mounted on a supporting wheel.

FIG. 3 shows a carrier 2 which is equipped with a semiconductor element 1 and a cooling member 9 and which is mounted on a supporting wheel 17. The supporting wheel 17 is secured to a shaft 18 but is electrically insulated from this (the insulation is not illustrated in the drawing). At its outer periphery, the supporting wheel 17 comprises recesses 19 in which equipped carriers are inserted. Disposed beside the recess 19 at the generated surface of the supporting wheel 17 are bolts 20 on which the supporting member 3 is placed and secured with nuts 21.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the present invention.

What is claimed is:

1. An arrangement for holding at least one disc-shaped semiconductor element on a support wheel, comprising:
   a support wheel having at least one recess on an outer circumference, said support wheel being provided on a shaft;
   at least one disc-shaped semiconductor element having first and second contact surfaces;
   at least one carrier, said carrier releasably receiving said at least one disc-shaped semiconductor element, with said carrier being releasably received within at least one said recess of said support wheel, said carrier including a support body and a yoke with said support body and said yoke being of unitary construction, said carrier having a first clamping surface provided on one side of the disc-shaped semiconductor element and a second clamping surface provided on another side of the disc-shaped semiconductor element; and
   biasing means for urging the first and the second clamping surfaces against the contact surfaces of the disc-shaped semiconductor element.

2. The arrangement of claim 1 further comprising cooling means for cooling said disc-shaped semiconductor element including a cooling member arranged between the semiconductor element and one of the clamping surfaces.

3. The arrangement of claim 2 wherein the cooling member is arranged between said another side of the semiconductor element and said second clamping surface of said yoke whereby said disc-shaped semiconductor element is releasably received between said first clamping surface and said cooling member.

4. The arrangement of claim 3 further comprising an insulating member provided between the cooling member and the yoke.

5. The arrangement of claim 4 wherein the cooling member is mounted on the insulating member as a ball and socket joint.

6. The arrangement of claim 1 wherein the biasing means includes at least one spring.

7. The arrangement of claim 1 wherein the biasing means includes a plurality of cup springs.

8. The arrangement of claim 7 wherein the plurality of cup springs are provided in a cylindrical bore of the yoke, the biasing means further including means for adjusting the compression of the spring including a thrust washer and a tightening screw.

9. The arrangement of claim 1 wherein the support body and the yoke are a single unit of a CrCu casting.

10. The arrangement of claim 1 wherein the support body includes a plurality of cooling fins.

11. The arrangement of claim 7 wherein the means for adjusting the compression of the springs provides an adjustment between 500 Kp and 1000 Kp, and preferably a compression of 800 Kp.

* * * * *